United States Patent [19]

Isohata

[11] Patent Number: 4,563,820
[45] Date of Patent: Jan. 14, 1986

[54] ALIGNING SYSTEM
[75] Inventor: Junji Isohata, Tokyo, Japan
[73] Assignee: Canon Kabushiki Kaisha, Tokyo, Japan
[21] Appl. No.: 542,978
[22] Filed: Oct. 18, 1983
[30] Foreign Application Priority Data Oct. 27, 1982 [JP] Japan ................. 57-189684

[51] Int. Cl.$^4$ ............................................. G01B 5/24
[52] U.S. Cl. .............................. 33/180 R; 33/1 M; 33/DIG. 2
[58] Field of Search .......... 33/1 M, 174 TA, 174 TD, 33/180 R, 181 R, DIG. 2; 308/5 R, DIG. 1

[56] References Cited

U.S. PATENT DOCUMENTS

| | | | |
|---|---|---|---|
| 3,231,319 | 1/1966 | Porath | 33/DIG. 2 |
| 3,736,818 | 6/1973 | Ennis | 33/1 M |
| 3,744,902 | 7/1973 | Henker | 33/1 M |
| 3,813,789 | 6/1974 | Shelton | 33/DIG. 2 |
| 3,831,283 | 8/1974 | Pagella et al. | 33/DIG. 2 |
| 4,414,749 | 11/1983 | Johannsmeier | 33/180 R |

FOREIGN PATENT DOCUMENTS

| | | | |
|---|---|---|---|
| 121640 | 9/1980 | Japan | 33/1 M |
| 197280 | 7/1965 | Sweden | 308/5 R |
| 658406 | 4/1979 | U.S.S.R. | 33/1 M |

Primary Examiner—Richard R. Stearns
Attorney, Agent, or Firm—Fitzpatrick, Cella, Harper & Scinto

[57] ABSTRACT

An aligning system for aligning a first object and second object with each other by moving them as a unit through a fluid bearing is adapted to accomplish a coarse alignment by displacing the first and second objects relative to each other and to attain a fine alignment by controlling the supply of pressure to the fluid bearing.

8 Claims, 12 Drawing Figures

ALIGNING SYSTEM

BACKGROUND OF THE INVENTION

1. Field of the Invention

This invention relates to an aligning system such as, for example, one to be used in the printing of semiconductor circuits in which high precision is required in transferring an image from a photomask to a wafer.

2. Description of the Prior Art

In the field of semiconductor circuit manufacture, very precise exposure that produce high quality exposures are desired in order to produce very fine-patterned and highly integrated circuits. This is particularly so in view of the trend of developments from ICs (integrated circuits to LSIs (large-scaled integrated circuits) to VLSIs (very large-scaled integrated circuits). Important capabilities required for such exposure apparatus are as follows:

(1) Printing performance for permitting printing of fine patterns of the order of 1 to 2 $\mu$m;

(2) Positioning precision for accurately positioning the pattern on a photomask relative to the pattern on a wafer which has been printed thereon from a photomask in the preceding printing step; and (3) Transfer precision for projecting the image of the photomask onto the wafer without magnification and distortion errors.

Figure 1:
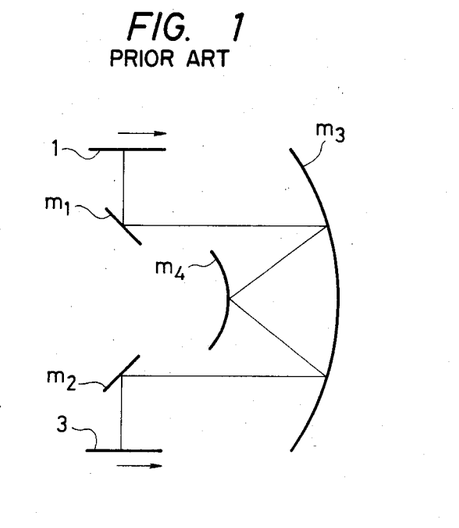
FIG. 1 is a schematic view of an exposure apparatus utilizing a mirror imaging optical system.

FIG. 1 shows a known semiconductor printing apparatus in which a wafer 3 is slit-exposed with the pattern of a photomask 1 through a mirror imaging optical system. The photomask and wafer are moved as in unison in the direction (shown by the arrows) perpendicular to the length of the slit to complete the entire exposure. In such semiconductor printing apparatus, if the photomask and wafer are displaced in unison in the lateral direction (X) of the slit, in the rotational direction ($\theta$) in a plane containing both the longitudinal direction of the slit and the above-mentioned lateral moving direction along which the photomask and wafer are moved, or in the direction (Y) in which the photomask and wafer are inclined with respect to the moving direction in a plane perpendicular to the longitudinal direction of the slit, during the aligning step prior to the exposure step, it is observed through an alignment optical system that the alignment marks on the photomask and wafer are displaced relative to each other by the amount two times the above displacement.

Therefore, the alignment between the alignment marks on the mask and wafer, i.e., the alignment between the mask and wafer through the aligning optical system is obtainable by displacing the mask and wafer as a unit in the direction X, Y or $\theta$.

As a mechanism for displacing the photomask and wafer, there is known a combination of movable stages utilizing rolling or sliding of balls with drives such as motors, cylinders or the like. Although in such mechanism, the amount of movement can be large, the movable stages may stick-and-slip and sometimes cannot move smoothly. Further, the drive system has a backlash which adversely affects the response in fine movement of the stages. Thus, the prior art mechanism for displacing the photomask and wafer requires a prolonged time period to complete the aligning step and can result in reduced accuracy and operability.

The above-mentioned problems themselves may be solved if a fluid bearing is used and the supply pressure to floating elements is controlled to ensure the alignment. With such means, however, the absolute amount of movement will not be large since the gap between the guide and floating element is limited due to the rigidity thereof.

SUMMARY OF THE INVENTION

It is an object of the present invention to provide an aligning system which utilizes fluid bearing means for supporting for movement in unison a first object and second object to be aligned with each other partially and successively and which has an increased range of positional adjustment as well as an improved response in the aligning steps.

Another object of the present invention is to provide an aligning system in which the first and second objects are first aligned with each other and then moved in unison to align them relative to a predetermined reference.

To accomplish these objects, according to the present invention, the alignment is achieved by a coarse ajustment in which the first and second objects are displaced relative to each other and a fine adjustment made under the pressure control of said fluid bearing means.

DESCRIPTION OF THE PREFERRED EMBODIMENTS

Figure 2:
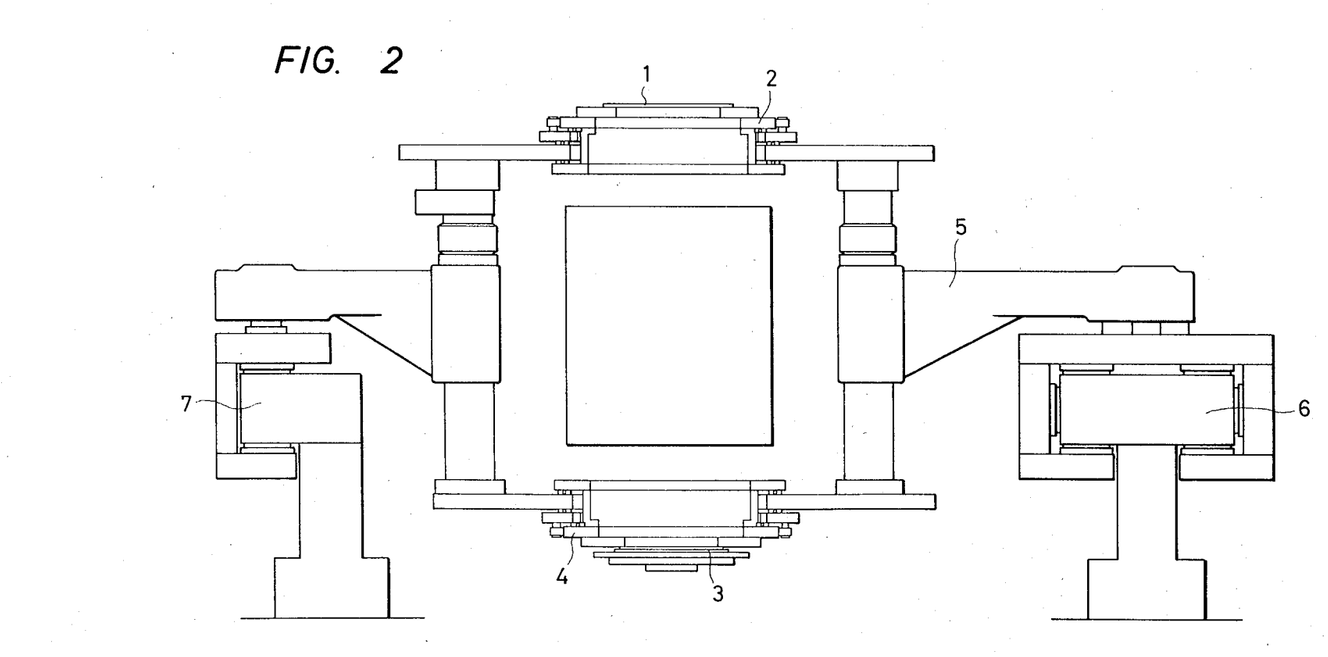
FIG. 2 is a view showing one embodiment of the present invention.

The present invention will now be described in connection with the embodiment thereof. In FIG. 2, denoted by 1 is a photomask 1 and denoted by 2 is a stage for moving the photomask 1. A wafer 3 is placed on another stage 4 for moving the it. These stages 2 and 4 are connected with each other through a connecting plate assembly 5. The stages 2 and 4 are supported through the connecting plate assembly 5 by an all-direction-controlling or restraining type air bearing 6 in which the attitude is controllable in the vertical and horizontal directions. Upon exposure, the photomask 1 and wafer 3 are moved as a unit in the direction perpendicular to the plane of the sheet of FIG. 2 so as to subject them to successive slit-exposure procedures. A vertical-direction-controlling or restraining type air bearing 7 also is provided which has merely a load carrying function without any influence on the attitude of each of the photomask and wafer.

First of all, a coarse alignment of the photomask and wafer is carried out by the stages 2 and 4. During the coarse alignment, the air bearing system is stationary.

The coarse alignment will be described, referring to FIG. 3.

Figure 3:
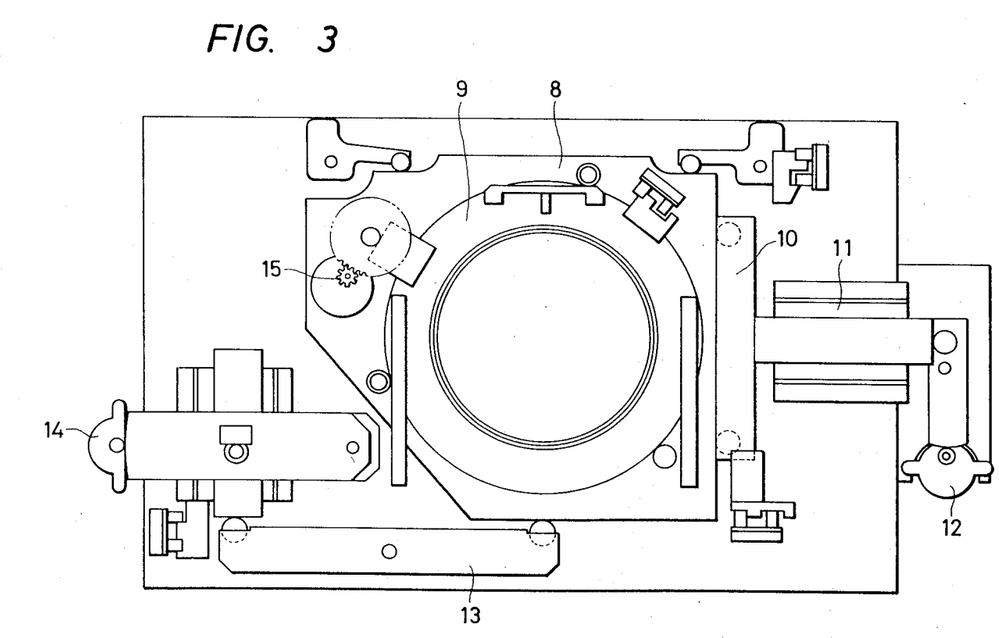
FIG. 3 is a plan view of a stage for moving a wafer.

FIG. 3 is a plan view of the wafer stage 4 which is movable by means of rolling or sliding of balls. The wafer stage 4 includes an X - Y motion plate 8, a θ rotation plate 9, and a T-shaped bar 10 for moving the X - Y motion plate 8 in the direction X. The bar 10 is restrained by a V-shaped guide 11 consisting of V-shaped grooves and balls. The bar 10 is driven by an X-axis motor 12. The X - Y motion plate 8 is moved in the direction Y by a bar 13 which is in turn driven by a Y-axis motor 14. The θ rotation plate 9 is driven by a θ-rotation motor 15. The photomask stage 2 is driven by another driving mechanism similar to that of the stage 4.

After the coarse alignment, i.e., relative alignment between the mask and wafer, through the movable stages, the supply pressures to the floating pads in the all-direction-controlling type air bearing 6 are individually controlled to perform a fine alignment. With this fine alignment, the photomask and wafer are set, as a unit, at predetermined positions which are optically conjugate with each other with respect to an imaging optical system ($m_1$ to $m_4$) (FIG. 1).

The control of the air bearing system will now be described in detail.

Figure 4:
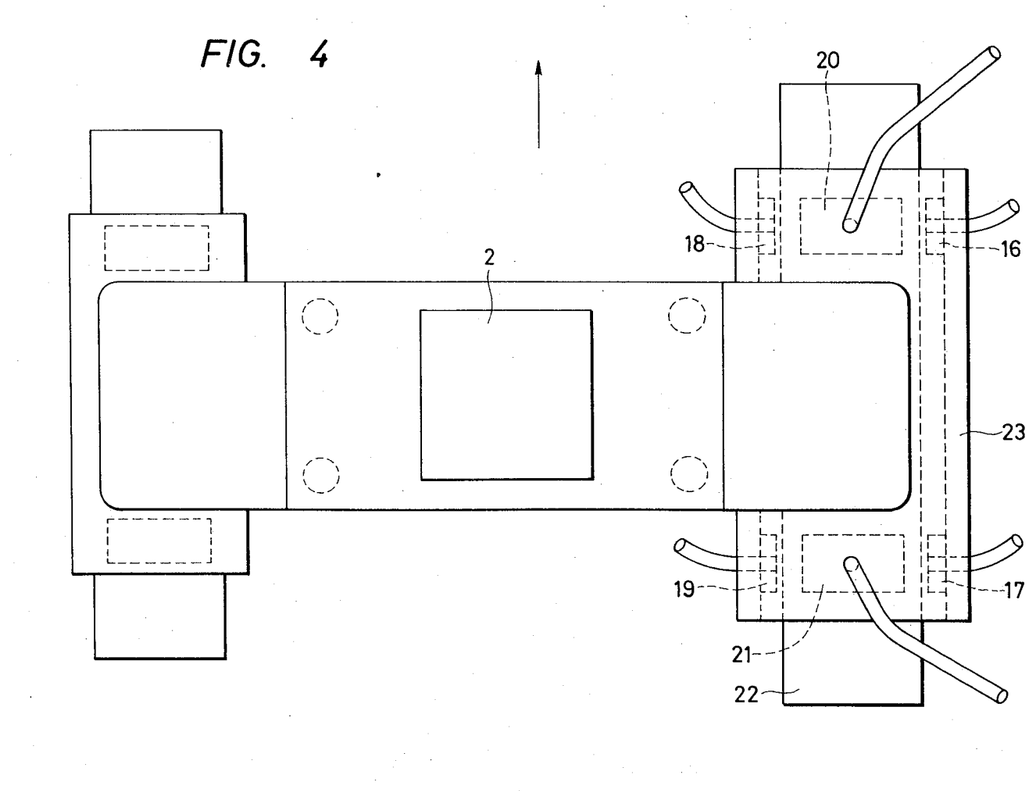
FIG. 4 is a view illustrating the construction of an all-direction-controlling or restraining type air bearing guide.

FIG. 4 shows the structure of the all-direction-controlling type air bearing guide which comprises a guide rail 22 and a slide member 23 movable in the direction the arrow. The slide member 23 is restrained by floating pads 16, 17, 18 and 19 in the lateral direction (direction X) and by floating pads 20 and 21 in the vertical direction.

Figure 5:
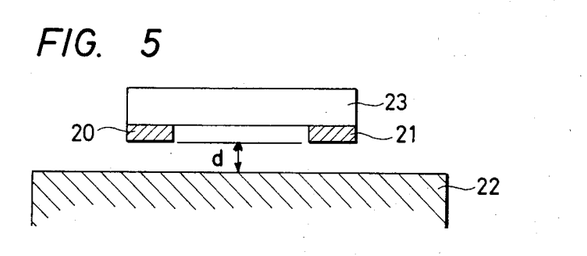
FIGS. 5 through 7 are side views of the air bearing guide, illustrating the alignment adjustment in the direction Y.
Figure 6:
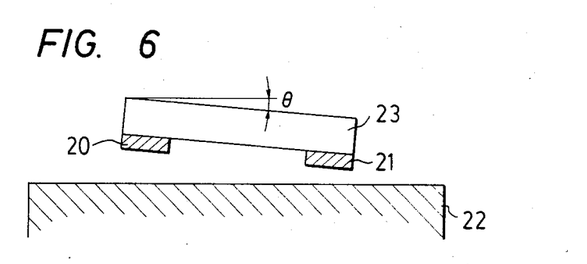

The process for aligning the photomask and wafer in the direction Y will be described with reference to FIGS. 5 through 7 which show the side views of the all-direction-controlling type air bearing guide. FIG. 5 shows the normal attitude of the slide member 23 in which the forward and rearward pads 20 and 21 are supplied with air under the same pressure to provide the same gap d between the respective pads and the guide rail. Upon alignment, the supply pressure to either of pads 20 or 21 is varied. FIG. 6 shows the attitude of the slide member 23 when the pressure to the pad 21 is decreased. Therefore, the gap between the guide rail 22 and the pad 21 is decreased so that the slide member 23 will be rotated about the pad 20 by an angle θ.

Figure 7:
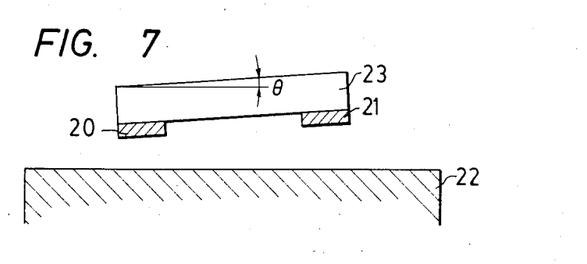

FIG. 7 shows the attitude of the slide member 23 when the pressure to the pad 21 is increased to increase the gap between the guide rail 22 and the pad 21. As a result, the slide member 23 is rotated about the pad 20 by the angle θ in the direction opposite to that of FIG. 6. When the slide member is rotated in such a manner, the photomask and wafer carried thereon also are rotated relative to the optical system by the same angle. In a reflection type printing apparatus, if the photomask and wafer are rotated as a unit relative to the optical system and when it is assumed that the rotational angle is θ° and the distance between the photomask and the wafer is l, the photomask and wafer are positioned relative to each other with a positional deviation represented by l tan θ. Thus, the aligning adjustment between the photomask and wafer in the direction Y can be effected in the above-described manner.

The aligning process of the photomask and wafer in the direction X will be described with reference to FIGS. 8 through 10 which show the top views of the all direction-controlling or restraining air bearing guide.

Figure 8:
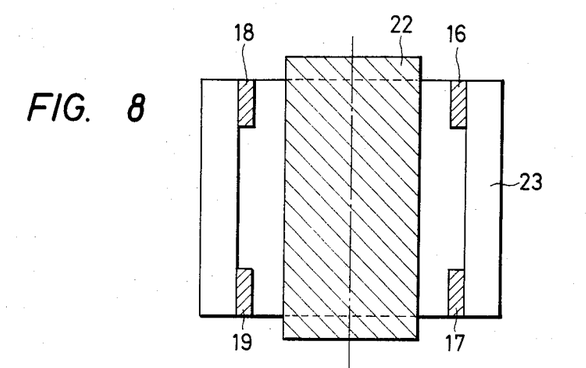
FIGS. 8 through 10 are plan views of the air bearing guide, illustrating the alignment adjustment in the direction X.

FIG. 8 shows the normal attitude of the slide member 23 in which the right- and left-hand pads are supplied with the same air pressure to establish the same gap between the guide rail and the respective pads. The aligning adjustment in the direction X can be performed by changing the supply pressure to one or each of the pads 16 and 17.

Figure 9:
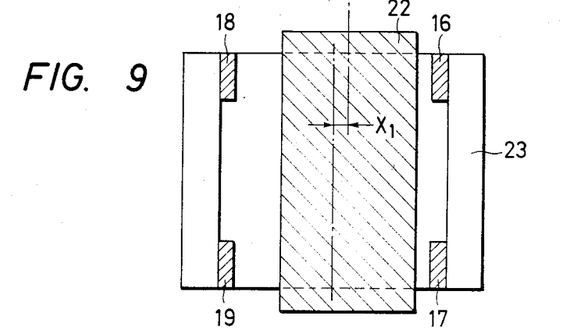

FIG. 9 shows the attitude of the slide member 23 when the air pressure to the pads 16 and 17 is decreased. As a result, the gap between the respective pads 16, 17 and the guide rail is reduced by $X_1$. Thus, the slide member 23 is deviated in the direction X by the amount $X_1$.

Figure 10:
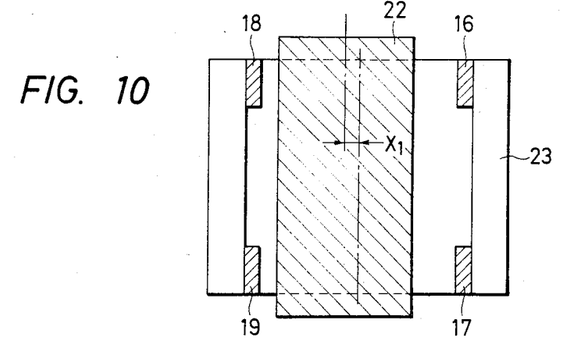

FIG. 10 shows the attitude of the slide member 23 when the pressure to the pads 16 and 17 is increased. The gap between the respective pads and the guide rail is therefore increased by $X_1$. As a result, the slide member 23 is deviated relative to the optical axis by the amount $X_1$ in the opposite direction to that of FIG. 9. The deviation of the slide member 23 leads to the same amount of deviation of the photomask and wafer carried thereon. In the reflection type printing apparatus, if the photomask and wafer are deviated relative to the optical axis by $X_1$, they are also deviated relative to each other by an amount equal to $2X_1$. Thus the aligning adjustment between the photomask and wafer in the direction X can be effected in the above-described manner.

The aligning process of the photomask and wafer in the direction θ will be described with reference to FIGS. 11 and 12 which show the top views of the all-direction-controlling or restraining type air bearing guide.

Figure 11:
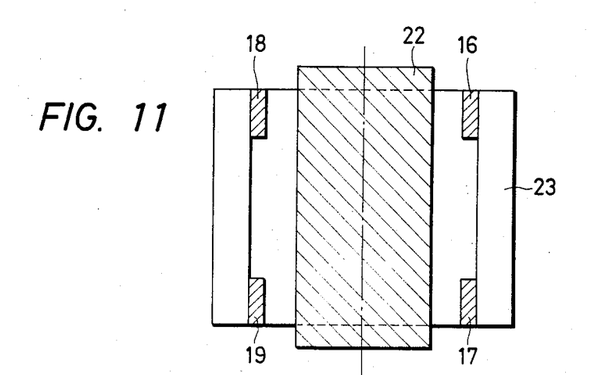
FIGS. 11 and 12 are plan views of the air bearing guide, illustrating the alignment adjustment in the direction $\theta$.

FIG. 11 shows the normal attitude of the slide member 23 in which the right- and left-hand pads are supplied with the same air pressure to define the same gap between the respective pads and the guide rail. In order to accomplish the alignment in the direction θ from the state shown in FIG. 11, the supply pressure to each of the pads 16, 17, 18 and 19 is varied.

Figure 12:
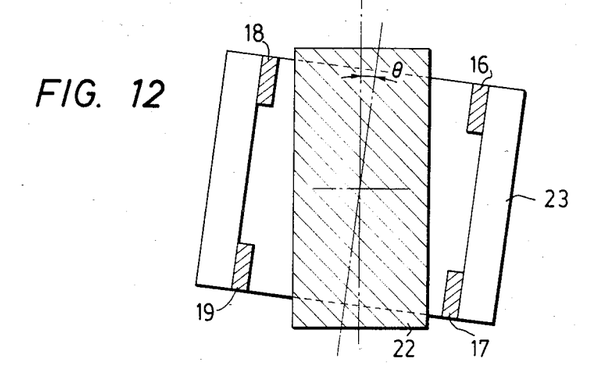

FIG. 12 shows the slide member 23 after completion of the alignment adjustment in the direction θ. The slide member 23 has been rotated by the amount θ by increasing the air pressure to the pads 16 and 19 and at the same time decreasing the air pressure to the pads 17 and 18. If the air pressure is conversely decreased in the pads 16 and 19 and simultaneously increased in the pads 17 and 18, the slide member 23 will be rotated by the same amount θ in the direction opposite to that of FIG. 12. As a result, the photomask and wafer are deviated relative to each other in the rotational direction by the same amount θ.

In this manner, the alignment can be made in the directions X, Y and θ.

As described above, the present invention provides an aligning system in which two objects such as, for example, photomask and wafer are moved as a unit by the use of fluid bearing means to successively subject them to exposure or other processes, and in which a coarse alignment can be attained by the conventional movable stages each having an increased amount of movement while a fine alignment can be accomplished by controlling the supply of pressure to the fluid bearing means. Thus, the present invention provides an aligning system of a simplified structure that is also highly precise, since the fluid bearing means is used for achieving both the alignment and in the exposure process or the like.

Although the present invention has been described in connection with the specific embodiment as an aligning system for aligning two objects such as photomask and wafer with each other by moving them as a unit, with a mirror imaging optical system for defining the directions X, θ and Y in an inverted system, the present invention can also be applied to other inverted optical systems or to ordinary exposure apparatus for performing the divided-printing process by moving two objects as a unit.

What I claim is:

1. An aligning system for aligning a first object and a second object with each other by establishing a predetermined condition between the two and in relation to an imaging optical system for projecting the image of the first object onto the second object, said aligning system comprising:

means for holding the first and second objects;

means for altering the condition between the first and second objects held by said holding means by moving one of the first and second objects relative to the other thereof; and means for supporting said holding means through fluid, said supporting means including means for further altering the condition between the first and second objects and in relation to the imaging optical system to the predetermined condition by changing the attitude of said holding means relative to the imaging optical system by controlling the pressure of said fluid through which said holding means is supported.

2. An aligning system as defined in claim 1, wherein said holding means is supported by said supporting means for movement relative to the imaging optical system in a predetermined direction.

3. An aligning system as defined in claim 1, wherein said supporting means includes a plurality of fluid supply ports, and wherein said further altering means is constructed to individually change the pressure of said fluid at each of said fluid supply ports.

4. An aligning system as defined in claim 3, wherein said supporting means comprises an air bearing.

5. An aligning system as defined in claim 1, wherein said altering means comprises means for moving one of the first and second objects relative to the other thereof by at least one of rolling and sliding action.

6. An aligning system as defined in claim 1, wherein said altering means is provided on said holding means.

7. An aligning system as defined in claim 6, wherein said altering means comprises means moving both of the first and second objects on said holding means.

8. An aligning system as defined in claim 1, wherein said supporting means is operable for further altering the condition between the first and second objects after said altering means has operated to alter the condition between the first and second objects.

* * * * *

UNITED STATES PATENT AND TRADEMARK OFFICE
CERTIFICATE OF CORRECTION

PATENT NO. : 4,563,820

DATED : January 14, 1986

INVENTOR(S) : JUNJI ISOHATA

It is certified that error appears in the above-identified patent and that said Letters Patent is hereby corrected as shown below:

Column 1, line 12, after "exposure" insert --apparatus--;
line 16, change "(integrated circuits to LSIs (large-scaled integrated)" to --(integrated circuits) to LSIs (large-scale integrated)--;
line 17, change "large-scaled" to --large-scale--;
line 32, change "as in" to --in--; and
line 59, change "may stick-and-slip" to --may stick and slip--.

Column 2, lines 20-21, change "ajustment" to --adjustment--;
line 49, change "by 1 is a photomask 1 and" to --by 1 is a photomask and--; and
line 51, change "the it." to --it.--.

Column 3, lines 29-30, change "direction the arrow." to --direction of the arrow.--; and
lines 67-68, change "all direction-controlling" to --all-direction-controlling--.

Signed and Sealed this

Twenty-sixth Day of August 1986

[SEAL]

Attest:

DONALD J. QUIGG

Attesting Officer     Commissioner of Patents and Trademarks